(12) United States Patent
Zhang

(10) Patent No.: US 11,121,351 B2
(45) Date of Patent: Sep. 14, 2021

(54) FLEXIBLE DISPLAY PANEL AND PREPARATION METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Fuyang Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 15 days.

(21) Appl. No.: 16/639,749

(22) PCT Filed: Nov. 20, 2019

(86) PCT No.: PCT/CN2019/119786
§ 371 (c)(1),
(2) Date: Feb. 18, 2020

(87) PCT Pub. No.: WO2021/036023
PCT Pub. Date: Mar. 4, 2021

(65) Prior Publication Data
US 2021/0066671 A1 Mar. 4, 2021

(30) Foreign Application Priority Data

Aug. 26, 2019 (CN) .......................... 201910789370.0

(51) Int. Cl.
*H01L 51/56* (2006.01)
*H01L 27/32* (2006.01)
(Continued)

(52) U.S. Cl.
CPC .......... *H01L 51/56* (2013.01); *H01L 27/3244* (2013.01); *H01L 51/0097* (2013.01);
(Continued)

(58) Field of Classification Search
None
See application file for complete search history.

(56) References Cited

U.S. PATENT DOCUMENTS 9,039,476 B2 * 5/2015 Song ................... H01L 51/5237
445/24
2014/0323006 A1 * 10/2014 Song ................... H01L 51/5256
445/24
(Continued)

FOREIGN PATENT DOCUMENTS

CN 106711176 A 5/2017
CN 107680994 A 2/2018
(Continued)

*Primary Examiner* — J. E. Schoenholtz
(74) *Attorney, Agent, or Firm* — Mark M. Friedman

(57) ABSTRACT

A flexible display panel and a preparation method thereof are provided. A composite substrate structure composed of a first polyimide layer, a water-oxygen barrier layer, a protective layer, and a second polyimide layer is prepared, and the protective layer covers a partial lateral side of the second polyimide layer in a non-display area and a lateral side of the water-oxygen barrier layer in the non-display area. Thus, the water and oxygen barrier property of the composite substrate structure is improved.

19 Claims, 4 Drawing Sheets

(51) Int. Cl.
*H01L 51/00* (2006.01)
*H01L 51/52* (2006.01)

(52) U.S. Cl.
CPC ........ *H01L 51/5253* (2013.01); *H01L 51/003* (2013.01); *H01L 2227/323* (2013.01); *H01L 2227/326* (2013.01); *H01L 2251/5338* (2013.01)

(56) References Cited

U.S. PATENT DOCUMENTS

| | | | |
|---|---|---|---|
| 2015/0014672 A1 | 1/2015 | Yamae et al. | |
| 2019/0157626 A1 | 5/2019 | Wang et al. | |
| 2019/0198582 A1* | 6/2019 | Yeo | H01L 27/3276 |
| 2019/0363305 A1* | 11/2019 | Suga | H05B 33/14 |
| 2020/0006685 A1 | 1/2020 | Xie | |

FOREIGN PATENT DOCUMENTS

| | | |
|---|---|---|
| CN | 107919364 A | 4/2018 |
| WO | 2013118508 A1 | 8/2013 |

* cited by examiner

FLEXIBLE DISPLAY PANEL AND PREPARATION METHOD THEREOF

CROSS-REFERENCES TO RELATED APPLICATIONS

The present application claims priority from a Chinese Patent Application filed with the Chinese Patent Office on Aug. 26, 2019, with Application No. 201910789370.0, entitled "FLEXIBLE DISPLAY PANEL AND PREPARATION METHOD THEREOF", the contents of which are incorporated herein by reference in their entirety.

FIELD OF DISCLOSURE

The present application relates to the field of display technology, and particularly relates to a flexible display panel and a preparation method thereof.

BACKGROUND OF DISCLOSURE

With the development of display technology, the requirements for color and portability are getting higher. The flexibility of display panels has become the general trend of the development of modern display devices. Flexible displays are gradually entering the consumer electronics market, such as mobile devices and televisions. Unlike traditional display technology using rigid substrates, the flexible displays use flexible substrates, such as flexible resins, flexible metal, and ultra-thin glass. Among them, the flexible resins are widely used in the substrates of the flexible displays because of their desired shaping and high surface flatness. However, compared with metal and glass, resin materials are susceptible to intrusions of oxygen ($O_2$), water ($H_2O$), and so on, which affect the reliability of the panel.

Technical Problems

Referring to FIG. 1A to FIG. 1B, FIG. 1A is a schematic structural diagram of an existing flexible display panel before being cut, and FIG. 1B is a schematic structural diagram of the existing flexible display panel after being cut. As shown in FIG. 1A, the existing flexible display panel before being cut comprises a panel area 11 and a panel edge area 13 divided by a laser cut line 12 (a cutting blade 19 cuts longitudinally along the laser cut line 12). The panel area 11 comprises a first polyimide layer 101a, a water-oxygen barrier layer 102, and a second polyimide layer 101b sequentially stacked and disposed, and a thin film transistor (TFT) array layer 103 and an organic light emitting layer 104 sequentially disposed on the second polyimide layer 101b. An encapsulation layer 105 is disposed on the organic light emitting layer 104, covers a lateral side of the thin film transistor array layer 103 and a lateral side of the organic light emitting layer 104 near the laser cut line 12, and partially covers the second polyimide layer 101b. The panel edge area 13 comprises a first polyimide layer 101a, a water-oxygen barrier layer 102, and a second polyimide layer 101b sequentially stacked and disposed. The water-oxygen barrier layer 102 is configured to block water/oxygen permeation from a bottom of the second polyimide layer 101b.

In the process of panel preparation, a laser or other means is used to cut along the laser cut line 12, the panel edge area 13 is cut off, and the final panel only retains the panel area 11, as shown in FIG. 1B.

For the existing flexible display panel after being cut, although the water-oxygen barrier layer 102 can block water/oxygen permeation from the bottom of the second polyimide layer 101b, the water/oxygen will permeate along a lateral side of the second polyimide layer 101b near the original laser cut line 12 (as shown by an arrow 18 in FIG. 1B), thereby permeating into the circuit of the thin film transistor array layer 103, and affecting the service lifespan of the light emitting material of the organic light emitting layer 104.

Therefore, how to prevent the damage to the reliability of the panel caused by water, oxygen, and other intrusions, and how to improve the reliability of the flexible display panel are the technical problems to be solved in the development of the flexible display panel at present.

SUMMARY OF DISCLOSURE

Technical Solutions

The purpose of the present application provides a flexible display panel and a preparation method thereof, aiming at the problems existing in the prior art, prevents the damage to the reliability of the panel caused by water, oxygen, and other intrusions, and improves the reliability of the flexible display panel.

To achieve the above purpose, the present application provides a preparation method of a flexible display panel comprising the following steps: providing a rigid substrate, wherein the rigid substrate has a panel area and a panel edge area divided by a laser cut line; preparing a first polyimide layer on the rigid substrate, wherein the first polyimide layer is formed in the panel area and the panel edge area; depositing a water-oxygen barrier layer on the first polyimide layer, wherein the water-oxygen barrier layer covers the first polyimide layer; preparing a protective layer on the water-oxygen barrier layer, wherein the protective layer extends from the laser cut line to the panel area and the panel edge area respectively, wherein an initial thickness of the protective layer ranges from 0.5 to 5 µm; preparing a second polyimide layer on the protective layer and the water-oxygen barrier layer; preparing a panel display assembly on the second polyimide layer corresponding to the panel area; and separating the rigid substrate from the first polyimide layer, and cutting the panel edge area along the laser cut line to obtain the flexible display panel, wherein the protective layer retained in the panel area after being cut covers a partial lateral side of the second polyimide layer at the laser cut line and a lateral side of the water-oxygen barrier layer at the laser cut line.

To achieve the above purpose, the present application further provides a preparation method of a flexible display panel comprising the following steps: providing a rigid substrate, wherein the rigid substrate has a panel area and a panel edge area divided by a laser cut line; preparing a first polyimide layer on the rigid substrate, wherein the first polyimide layer is formed in the panel area and the panel edge area; depositing a water-oxygen barrier layer on the first polyimide layer, wherein the water-oxygen barrier layer covers the first polyimide layer; preparing a protective layer on the water-oxygen barrier layer, wherein the protective layer extends from the laser cut line to the panel area and the panel edge area respectively; preparing a second polyimide layer on the protective layer and the water-oxygen barrier layer; preparing a panel display assembly on the second polyimide layer corresponding to the panel area; and separating the rigid substrate from the first polyimide layer, and cutting the panel edge area along the laser cut line to obtain the flexible display panel.

To achieve the above purpose, the present application further provides a flexible display panel comprising a panel area, wherein the panel area comprises a display area and a non-display area; the flexible display panel further comprising a flexible base substrate, wherein the flexible base substrate comprises a first polyimide layer, a water-oxygen barrier layer, and a second polyimide layer sequentially stacked and disposed, and the flexible base substrate further comprises a protective layer disposed in the non-display area, wherein the protective layer covers a partial lateral side of the second polyimide layer in the non-display area and a lateral side of the water-oxygen barrier layer in the non-display area; and a panel display assembly disposed on the flexible base substrate.

Beneficial Effects

By preparing a composite substrate structure composed of a first polyimide layer, a water-oxygen barrier layer, a protective layer, and a second polyimide layer, the flexible display panel of the present application has desired water and oxygen barrier property and flexibility, and the protective layer covers a partial lateral side of the second polyimide layer in the non-display area and a lateral side of the water-oxygen barrier layer in the non-display area. Thus, the water and oxygen barrier property of the composite substrate structure is improved, thereby greatly reducing the probability of water and oxygen passing through the flexible base substrate, and improving the service lifespan of the flexible display panel.

DESCRIPTION OF DRAWINGS

In order to clearly illustrate the embodiments of the present disclosure, the following briefly introduces the accompanying drawings used in the embodiments. Obviously, the drawings in the following description merely show some of the embodiments of the present disclosure. As regards one of ordinary skill in the art, other drawings may be obtained in accordance with these accompanying drawings without making creative efforts.

DETAILED DESCRIPTION OF PREFERRED EMBODIMENTS

Figure 1A:
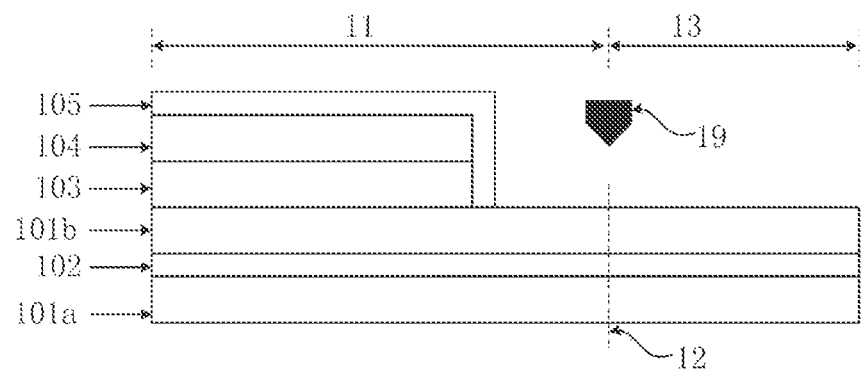
FIG. 1A is a schematic structural diagram of an existing flexible display panel before being cut.
Figure 1B:
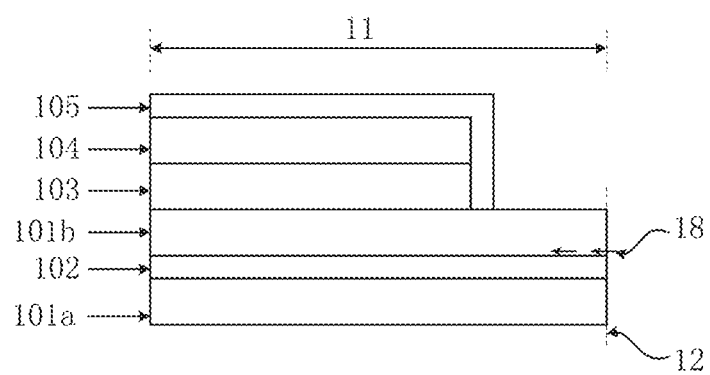
FIG. 1B is a schematic structural diagram of the existing flexible display panel after being cut.

The embodiments of the present application are described in detail below, and examples of the embodiments are shown in the drawings, wherein the same or similar reference numerals indicate the same or similar elements or elements having the same or similar functions throughout. The embodiments described below with reference to the drawings are exemplary and are only used to explain the present application, and should not be construed as limiting the present application.

The terms "first", "second", "third", and the like (if present) in the description and claims of the present application and the drawings are used to distinguish similar objects, and are not necessarily used to describe a specific order or sequence. It should be understood that the objects described in this way are interchangeable under appropriate circumstances. In addition, the terms "including" and "having" and any variations thereof are intended to cover the inclusion without exclusion.

In the present application, unless explicitly stated and defined otherwise, the first feature "above" or "below" the second feature may include that the first feature is directly contact with the second feature, and may also include that the first feature is indirectly contact with the second feature through other features between them. Moreover, the first feature "above", "on" and "over" the second feature includes that the first feature is directly above and obliquely above the second feature, or merely indicates that the first feature is higher in level than the second feature. The first feature "below", "under" and "beneath" the second feature includes that the first feature is directly below and obliquely below the second feature, or merely indicates that the first feature is lower in level than the second feature.

The following disclosure provides many different embodiments or examples for implementing different structures of the present application. To simplify the disclosure of the present application, the components and settings of specific examples are described below. Of course, they are merely examples and are not intended to limit the present application. The present application may repeat reference numerals and/or reference letters in different examples. Such repetition is for simplicity and clarity, and does not indicate a relationship between the various embodiments and/or settings discussed. In addition, the present application provides examples of various specific processes and materials, but those skilled in the art may be aware of the applications of other processes and/or the use of other materials.

Figure 2:
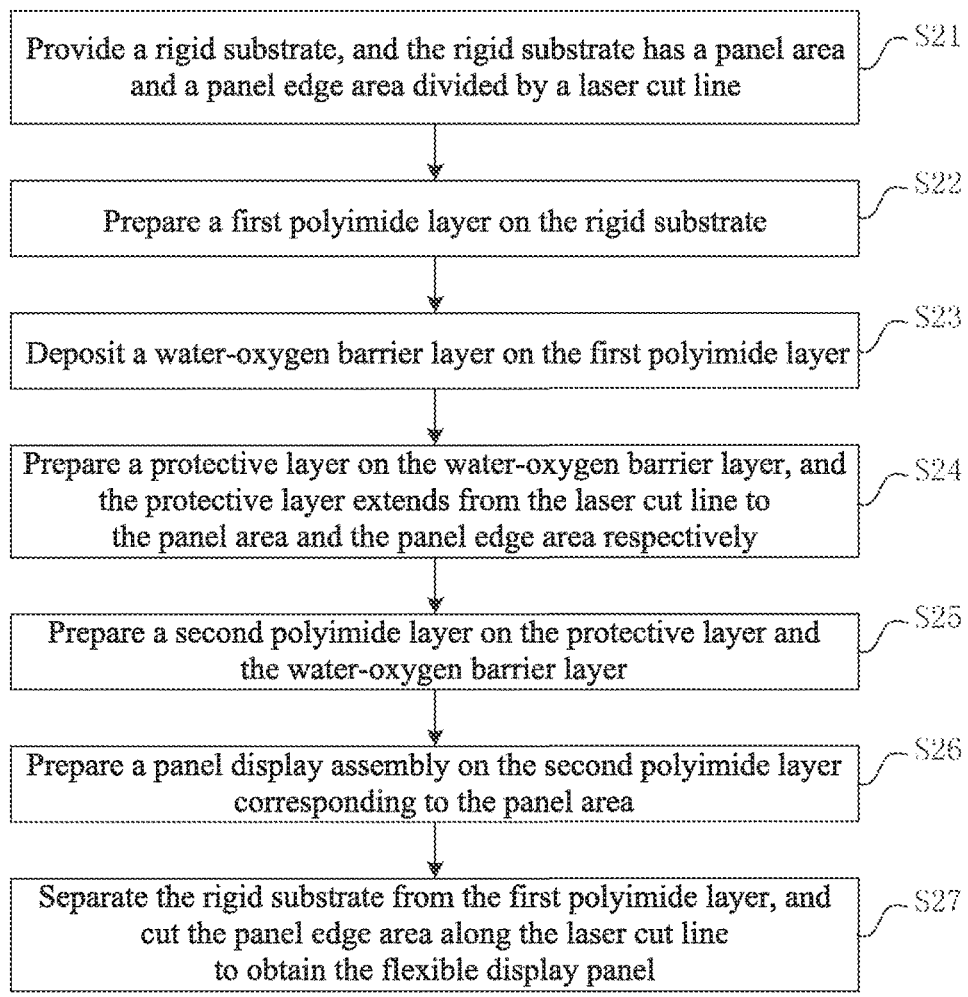
FIG. 2 is a schematic flowchart of a preparation method a flexible display panel according to the present application.

Referring to FIG. 2, FIG. 2 is a schematic flowchart of a preparation method a flexible display panel according to the present application. The preparation method of the present application comprises the steps as follows. S21: a rigid substrate is provided, wherein the rigid substrate has a panel area and a panel edge area divided by a laser cut line; S22: a first polyimide layer is prepared on the rigid substrate; S23: a water-oxygen barrier layer is deposited on the first polyimide layer; S24: a protective layer is prepared on the water-oxygen barrier layer, wherein the protective layer extends from the laser cut line to the panel area and the panel edge area respectively; S25: a second polyimide layer is prepared on the protective layer and the water-oxygen barrier layer; S26: a panel display assembly is prepared on the second polyimide layer corresponding to the panel area; and S27: the rigid substrate is separated from the first polyimide layer, and the panel edge area is cut along the laser cut line to obtain the flexible display panel. The detailed description is given below in combination with the drawings.

S21: a rigid substrate is provided, wherein the rigid substrate has a panel area and a panel edge area divided by a laser cut line.

In a further embodiment, the rigid substrate may be a glass substrate, a silicon wafer, a metal or a rigid thin film. The rigid substrate needs to have a high laser transmittance to facilitate the subsequent laser stripping process.

S22: a first polyimide layer is prepared on the rigid substrate.

In a further embodiment, the first polyimide layer covers the panel area and the panel edge area.

In a further embodiment, a material of the first polyimide layer is a polyimide resin or a modified polyimide resin, and a thickness of the first polyimide layer ranges from 5 to 15 µm, preferably 10 µm.

S23: a water-oxygen barrier layer is deposited on the first polyimide layer.

In a further embodiment, the water-oxygen barrier layer covers the first polyimide layer, and, that is, the water-oxygen barrier layer corresponds to the panel area and the panel edge area.

In a further embodiment, a material of the water-oxygen barrier layer is silicon oxide ($SiO_x$) or silicon nitride ($SiN_x$), and a thickness of the water-oxygen barrier layer ranges from 0.2 to 1 µm, preferably 0.5 µm. The water-oxygen barrier layer is configured to block water and oxygen from permeating into the second polyimide layer subsequently prepared, so as to prevent the damage to a panel display assembly prepared on the flexible base substrate (e.g., the circuit of the thin film transistor array layer and the light emitting material of the light emitting layer) caused by water, oxygen, and other intrusions, and improve the reliability of the prepared flexible display panel.

S24: a protective layer is prepared on the water-oxygen barrier layer, wherein the protective layer extends from the laser cut line to the panel area and the panel edge area respectively.

In a further embodiment, a material of the protective layer comprises at least one of aluminum, tin, lead, bismuth, silver, and copper. The material of the protective layer may be at least one of an aluminum-based alloy, a tin-based alloy, a lead-based alloy, a bismuth-based alloy, a silver-based alloy, and a copper-based alloy. An initial thickness of the protective layer ranges from 0.5 to 5 µm, preferably 0.5 µm, 1 µm, or 2 µm. In the subsequent preparation of the flexible display panel, a laser or other means is used to cut along the laser cut line, the panel edge area is cut off, and the final panel only retains the panel area. The retained panel area after being cut having a portion of the protective layer retained near the laser cut line, which can block the permeation of water and oxygen into the second polyimide layer from a side near the laser cut line. Thus, the flexible base substrate has excellent ability to block water and oxygen, and the reliability of the prepared flexible display panel is further improved.

S25: a second polyimide layer is prepared on the protective layer and the water-oxygen barrier layer.

In a further embodiment, the second polyimide layer covers the protective layer and the water-oxygen barrier layer, and, that is, the second polyimide layer corresponds to the panel area and the panel edge area.

In a further embodiment, a material of the second polyimide layer is a polyimide resin or a modified polyimide resin, and a thickness of the second polyimide layer ranges from 5 to 15 µm, preferably 10 µm. The thicknesses of the first polyimide layer and the second polyimide layer may be different, and the specific thicknesses can be selected according to the actual device type.

S26: a panel display assembly is prepared on the second polyimide layer corresponding to the panel area.

In a further embodiment, a thin film transistor array layer, a light emitting layer, and an encapsulation layer are sequentially prepared on the second polyimide layer corresponding to the panel area. The encapsulation layer covers a lateral side of the thin film transistor array layer and a lateral side of the light emitting layer near the laser cut line, and partially covers the second polyimide layer.

In a further embodiment, the thin film transistor array layer comprises a gate insulating layer (GI) and a dielectric layer (OLD) stacked and disposed, and functional components arranged inside. The functional components comprise a polysilicon layer, a gate electrode (GE), and a source/drain electrode (S/D). The thin film transistor array layer has a conventional structure, and the material and the thickness of each film layer adopted can be adjusted according to the requirements, and are not specifically limited in the present application. The encapsulation layer has a conventional structure, and the material and the thickness adopted can be adjusted according to the requirements.

In a further embodiment, the light emitting layer is an organic light emitting diode (OLED) light emitting layer, and, that is, the prepared flexible display panel is an OLED flexible display panel. The OLED light emitting layer comprises an anode, an OLED light emitting material layer, and a cathode stacked and disposed. The OLED light emitting layer has a conventional structure, and the material and the thickness of each film layer adopted can be adjusted according to the requirements, and are not specifically limited in the present application. In other embodiments, a quantum dot (QD)—OLED flexible display panel and other light emitting flexible display panels can be prepared according to the requirements.

S27: the rigid substrate is separated from the first polyimide layer, and the panel edge area is cut along the laser cut line to obtain the flexible display panel.

In a further embodiment, the rigid substrate is separated from the first polyimide layer using the laser stripping process, and the panel edge area is cut along the laser cut line using the laser to obtain the flexible display panel. The laser stripping process and the laser cutting process may be operated according to the conventional process in the art, and are not specifically limited in the present application.

In a further embodiment, the protective layer is melted and solidified in a cutting process. The protective layer retained in the panel area after being cut covers a partial lateral side of the second polyimide layer at the laser cut line and a lateral side of the water-oxygen barrier layer at the laser cut line. A thickness of the protective layer retained in the panel area after being cutting is greater than a thickness of the water-oxygen barrier layer, thereby completely covering a lateral side of the water-oxygen barrier layer at the laser cut line. For example, the thickness of the protective layer may range from 1 to 10 µm, preferably 2 µm or 5 µm.

In a further embodiment, the protective layer retained in the panel area after being cut further covers a partial lateral side of the first polyimide layer at the laser cut line.

The present application provides a novel preparation method of a flexible display panel. A composite substrate structure composed of a first polyimide layer, a water-oxygen barrier layer, a protective layer, and a second polyimide layer having desired water and oxygen barrier property and flexibility is prepared, and the retained protective layer after being cut covers a partial lateral side of the second polyimide layer at the original laser cut line and a lateral side of the water-oxygen barrier layer at the original laser cut line. Thus, the water and oxygen barrier property of the composite substrate structure is improved, thereby greatly reducing the probability of water and oxygen passing through the flexible base substrate, and improving the service lifespan of the prepared flexible display panel.

Figure 3A:
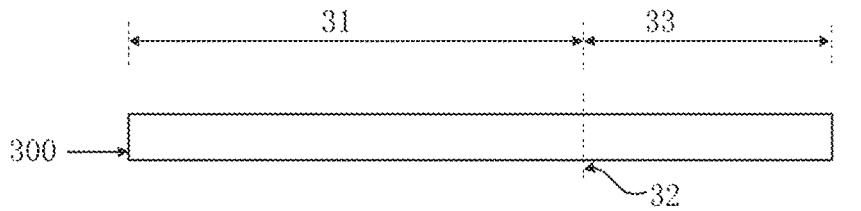
FIG. 3A to FIG. 3F are flowcharts of the preparation of a flexible display panel according to an embodiment of the present application.
Figure 3B:
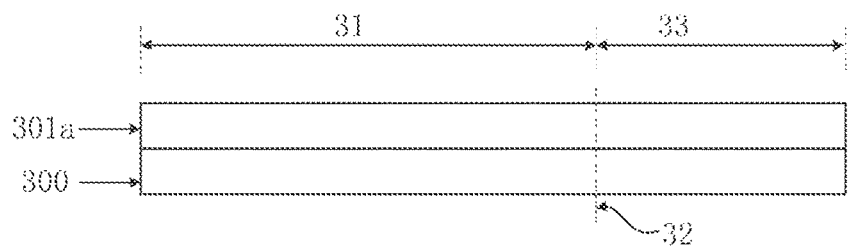
Figure 3C:
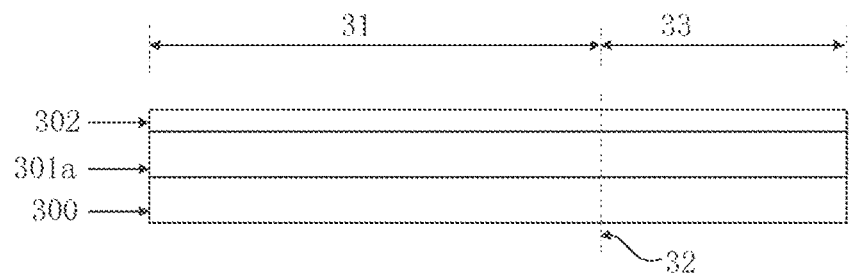
Figure 3D:
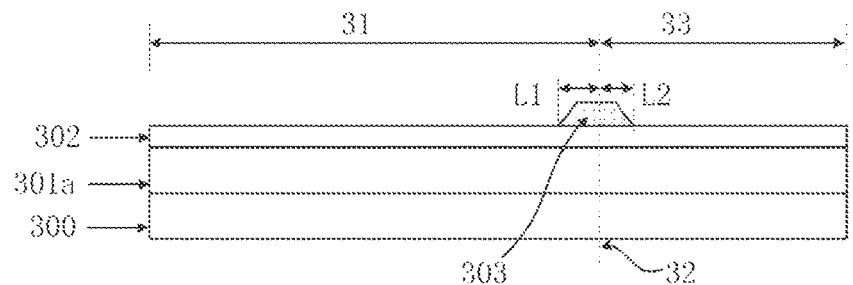
Figure 3E:
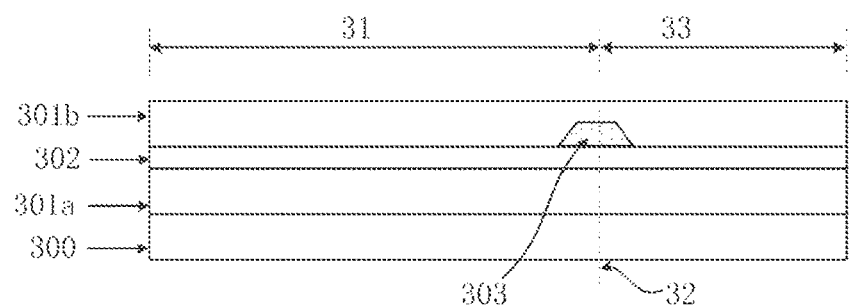
Figure 3F:
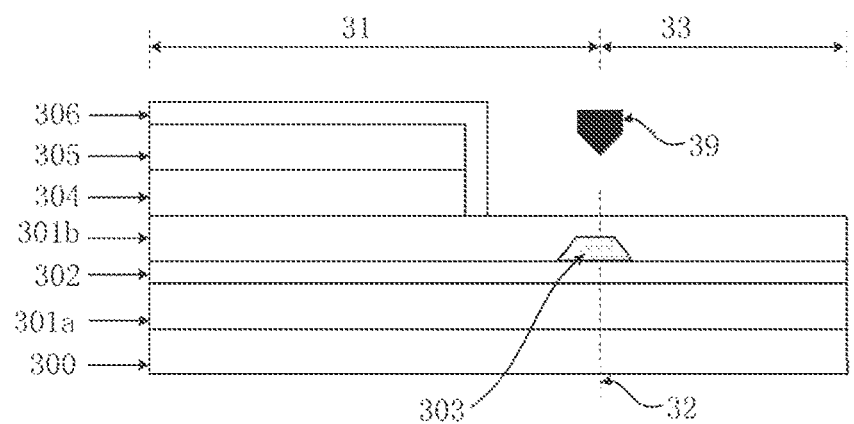
Figure 4:
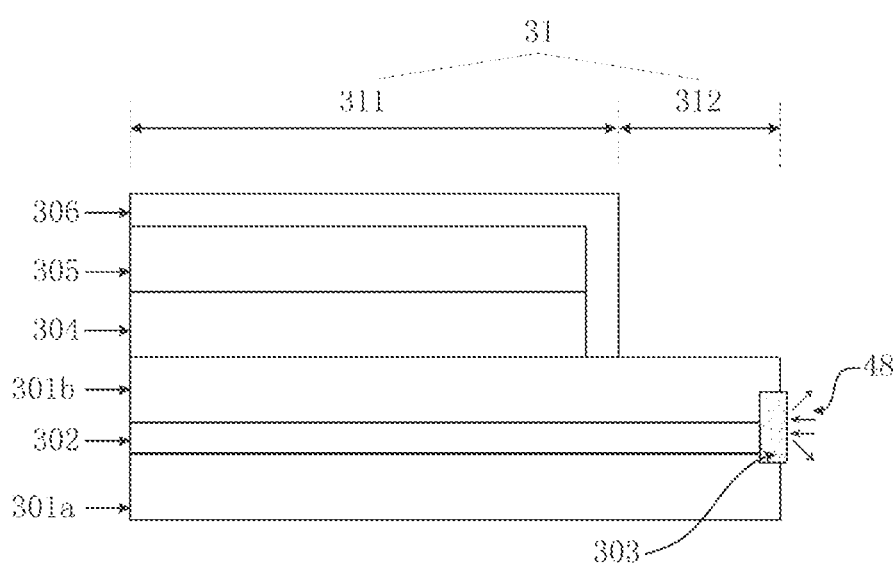
FIG. 4 is a schematic layered structural diagram of a flexible display panel according to an embodiment of the present application.

Referring to FIG. 2, FIG. 3A to FIG. 3F, and FIG. 4 together, FIG. 3A to FIG. 3F are flowcharts of the preparation of a flexible display panel according to an embodiment of the present application, and FIG. 4 is a schematic layered structural diagram of a flexible display panel according to an embodiment of the present application.

Regarding to the step S21: a rigid substrate is provided, wherein the rigid substrate has a panel area and a panel edge area divided by a laser cut line. Referring to FIG. 2 and FIG. 3A together, FIG. 3A is a cross-sectional view of a rigid substrate according to an embodiment of the present application. As shown in FIG. 3A, the rigid substrate 300 has a panel area 31 and a panel edge area 33 divided by a laser cut line 32.

In a further embodiment, the rigid substrate 300 may be a glass substrate, a silicon wafer, a metal or a rigid thin film. The rigid substrate needs to have a high laser transmittance to facilitate the subsequent laser stripping process.

Regarding to the step S22: a first polyimide layer is prepared on the rigid substrate. Referring to FIG. 2 and FIG. 3B together, FIG. 3B is a cross-sectional view of a first polyimide layer prepared on the rigid substrate according to an embodiment of the present application. The first polyimide layer 301a covers the panel area 31 and the panel edge area 33.

In a further embodiment, a material of the first polyimide layer 301a is a polyimide resin or a modified polyimide resin, and a thickness of the first polyimide layer 301a ranges from 5 to 15 μm, preferably 10 μm.

Regarding to the step S23: a water-oxygen barrier layer is deposited on the first polyimide layer. Referring to FIG. 2 and FIG. 3C together, FIG. 3C is a cross-sectional view of a water-oxygen barrier layer prepared on the first polyimide layer according to an embodiment of the present application. The water-oxygen barrier layer 302 covers the first polyimide layer 301a, and, that is, the water-oxygen barrier layer 302 corresponds to the panel area 31 and the panel edge area 33.

In a further embodiment, a material of the water-oxygen barrier layer 302 is silicon oxide ($SiO_x$) or silicon nitride ($SiN_x$), and a thickness of the water-oxygen barrier layer 302 ranges from 0.2 to 1 μm, preferably 0.5 μm. The water-oxygen barrier layer 302 is configured to block water and oxygen from permeating into the second polyimide layer 301b subsequently prepared, so as to prevent the damage to a panel display assembly prepared on the flexible base substrate (e.g., the circuit of the thin film transistor array layer and the light emitting material of the light emitting layer) caused by water, oxygen, and other intrusions, and improve the reliability of the prepared flexible display panel.

Regarding to the step S24: a protective layer is prepared on the water-oxygen barrier layer, wherein the protective layer extends from the laser cut line to the panel area and the panel edge area respectively. Referring to FIG. 2 and FIG. 3D together, FIG. 3D is a cross-sectional view of a protective layer prepared on the water-oxygen barrier layer according to an embodiment of the present application. As shown in FIG. 3D, the protective layer 303 is prepared on the water-oxygen barrier layer 302, and extends from the laser cut line 32 to the panel area 31 and the panel edge area 33 respectively.

In a further embodiment, the protective layer 303 extends a first distance L1 from the laser cut line 32 to the panel area 31, the protective layer 303 extends a second distance L2 from the laser cut line 32 to the panel edge area 33, and the first distance L1 is greater than or equal to the second distance L2.

In a further embodiment, a material of the protective layer 303 comprises at least one of aluminum, tin, lead, bismuth, silver, and copper. The material of the protective layer 303 may be at least one of alloy materials, such as an aluminum-based alloy, a tin-based alloy, a lead-based alloy, a bismuth-based alloy, a silver-based alloy, and a copper-based alloy. An initial thickness of the protective layer 303 ranges from 0.5 to 5 μm, preferably 0.5 μm, 1 μm, or 2 μm. In the subsequent preparation of the flexible display panel, a laser or other means is used to cut along the laser cut line 32, the panel edge area 33 is cut off, and the final panel only retains the panel area 31. The retained panel area 31 after being cut having a portion of the protective layer 303 retained near the laser cut line 32, which can block the permeation of water and oxygen into the second polyimide layer 301b from a side near the laser cut line 32. Thus, the flexible base substrate has excellent ability to block water and oxygen, and the reliability of the prepared flexible display panel is further improved.

Regarding to the step S25: a second polyimide layer is prepared on the protective layer and the water-oxygen barrier layer. Referring to FIG. 2 and FIG. 3E together, FIG. 3E is a cross-sectional view of a second polyimide layer prepared on the protective layer and the water-oxygen barrier layer according to an embodiment of the present application. The second polyimide layer 301b covers the protective layer 303 and the water-oxygen barrier layer 302, and, that is, the second polyimide layer 301b corresponds to the panel area 31 and the panel edge area 33.

In a further embodiment, a material of the second polyimide layer 301b is a polyimide resin or a modified polyimide resin, and a thickness of the second polyimide layer 301b ranges from 5 to 15 μm, preferably 10 μm. The thicknesses of the first polyimide layer 301a and the second polyimide layer 301b may be different, and the specific thicknesses can be selected according to the actual device type.

Regarding to the step S26: a panel display assembly is prepared on the second polyimide layer corresponding to the panel area. Referring to FIG. 2 and FIG. 3F together, FIG. 3F is a cross-sectional view of a flexible display panel before being cut according to an embodiment of the present application. In the subsequent cutting, a cutting position of a cutting blade 39 (may be a laser cutting blade) corresponds to the laser cut line 32. A width of the protective layer 303 is greater than a width of the cutting blade 39, so that a portion of the protective layer 303 is retained in the panel area 31 after being cut.

In the present embodiment, a thin film transistor array layer 304, a light emitting layer 305, and an encapsulation layer 306 are sequentially prepared on the second polyimide layer 301b corresponding to the panel area 31. The encapsulation layer 306 covers a lateral side of the thin film transistor array layer 304 and a lateral side of the light emitting layer 305 near the laser cut line 32, and partially covers the second polyimide layer 301b.

In a further embodiment, the thin film transistor array layer 304 comprises a gate insulating layer (GI) and a dielectric layer (OLD) stacked and disposed, and functional components arranged inside. The functional components comprise a polysilicon layer, a gate electrode (GE), and a source/drain electrode (S/D). The thin film transistor array layer 304 has a conventional structure, and the material and the thickness of each film layer adopted can be adjusted according to the requirements, and are not specifically limited in the present application.

In a further embodiment, the light emitting layer 305 is an OLED light emitting layer, and, that is, the prepared flexible display panel is an OLED flexible display panel. The OLED light emitting layer comprises an anode, an OLED light emitting material layer, and a cathode stacked and disposed. The OLED light emitting layer has a conventional structure, and the material and the thickness of each film layer adopted can be adjusted according to the requirements, and are not specifically limited in the present application. In other embodiments, a quantum dot (QD)—OLED flexible display panel and other light emitting flexible display panels can be prepared according to the requirements.

The encapsulation layer 306 has a conventional structure, and the material and the thickness adopted can be adjusted according to the requirements, and are not specifically limited in the present application.

Regarding to the step S27: the rigid substrate is separated from the first polyimide layer, and the panel edge area is cut along the laser cut line to obtain the flexible display panel, Referring to FIG. 2 and FIG. 4 together, FIG. 4 is a schematic layered structural diagram of a flexible display panel according to an embodiment of the present application.

In a further embodiment, the rigid substrate 300 is separated from the first polyimide layer 301a using the laser stripping process, and the panel edge area 33 is cut along the laser cut line 32 using the laser to obtain the flexible display panel. The laser stripping process and the laser cutting process may be operated according to the conventional process in the art, and are not specifically limited in the present application.

In a further embodiment, the protective layer 303 is melted and solidified in a cutting process. The protective layer 303 retained in the panel area 31 after being cut covers a partial lateral side of the second polyimide layer 301b at the laser cut line 32 and a lateral side of the water-oxygen barrier layer 302 at the laser cut line 32. A thickness of the protective layer 303 retained in the panel area 31 after being cutting is greater than a thickness of the water-oxygen barrier layer 302, thereby completely covering a lateral side of the water-oxygen barrier layer 302 at the laser cut line 32. For example, the thickness of the protective layer 303 may range from 1 to 10 µm, preferably 2 µm or 5 µm.

In a further embodiment, the protective layer 303 retained in the panel area 31 after being cut further covers a partial lateral side of the first polyimide layer 301a at the laser cut line 32.

The retained panel area 31 after being cut having a portion of the protective layer 303 retained near the laser cut line 32, which can block the permeation of water and oxygen into the second polyimide layer 301b from a side near the laser cut line 32 (an arrow 48 in FIG. 4 indicates that the permeation of water and oxygen is blocked). Thus, the flexible base substrate has excellent ability to block water and oxygen, and the reliability of the prepared flexible display panel is further improved.

Referring to FIG. 4 again, the present application further provides a flexible display panel. The flexible display panel comprises a panel area 31. The panel area 31 comprises a display area 311 and a non-display area 312. The flexible display panel further comprises a flexible base substrate, and a panel display assembly disposed on the flexible base substrate.

Particularly, the flexible base substrate comprises a first polyimide layer 301a, a water-oxygen barrier layer 302, and a second polyimide layer 301b sequentially stacked and disposed. The flexible base substrate further comprises a protective layer 303 disposed in the non-display area 312. The protective layer 303 covers a partial lateral side of the second polyimide layer 301b in the non-display area 312 and a lateral side of the water-oxygen barrier layer 302 in the non-display area 312.

In a further embodiment, the first polyimide layer 301a is formed in the display area 311 and the non-display area 312. A material of the first polyimide layer 301a is a polyimide resin or a modified polyimide resin, and a thickness of the first polyimide layer 301a ranges from 5 to 15 µm, preferably 10 µm.

In a further embodiment, the water-oxygen barrier layer 302 covers the first polyimide layer 301a. A material of the water-oxygen barrier layer 302 is silicon oxide ($SiO_x$) or silicon nitride ($SiN_x$), and a thickness of the water-oxygen barrier layer 302 ranges from 0.2 to 1 µm, preferably 0.5 µm. The water-oxygen barrier layer 302 is configured to block water and oxygen from permeating into the second polyimide layer 301b subsequently prepared, so as to prevent the damage to a panel display assembly prepared on the flexible base substrate (e.g., the circuit of the thin film transistor array layer and the light emitting material of the light emitting layer) caused by water, oxygen, and other intrusions, and improve the reliability of the flexible display panel adopting the flexible base substrate of the present application.

In a further embodiment, an outer surface of the protective layer 303 protrudes from a lateral side of the non-display area 312, so as to well block the permeation of water and oxygen into the second polyimide layer 301b from a side of the non-display area 312. In a further embodiment, the protective layer 303 further covers a partial lateral side of the first polyimide layer 301a at the laser cut line 32.

In a further embodiment, a material of the protective layer 303 comprises at least one of aluminum, tin, lead, bismuth, silver, and copper. The material of the protective layer 303 may be at least one of alloy materials, such as an aluminum-based alloy, a tin-based alloy, a lead-based alloy, a bismuth-based alloy, a silver-based alloy, and a copper-based alloy. A thickness of the protective layer 303 is greater than a thickness of the water-oxygen barrier layer 302, thereby completely covering a lateral side of the water-oxygen barrier layer 302 at the laser cut line 32. For example, the thickness of the protective layer 303 may range from 1 to 10 µm, preferably 2 µm or 5 µm. Since the protective layer 303 covers a partial lateral side of the second polyimide layer 301b in the non-display area 312 and a lateral side of the water-oxygen barrier layer 302 in the non-display area 312, which can block the permeation of water and oxygen into the second polyimide layer 301b from a side of the non-display area 312 (an arrow 48 in FIG. 4 indicates that the permeation of water and oxygen is blocked). Thus, the flexible base substrate has excellent ability to block water and oxygen, and the reliability of the flexible display panel is further improved.

In a further embodiment, the second polyimide layer 301b covers the protective layer 303 and the water-oxygen barrier layer 302. A material of the second polyimide layer 301b is a polyimide resin or a modified polyimide resin, and a thickness of the second polyimide layer 301b ranges from 5 to 15 µm, preferably 10 µm. The thicknesses of the first polyimide layer 301a and the second polyimide layer 301b may be different, and the specific thicknesses can be selected according to the actual device type.

In a further embodiment, the panel display assembly comprise a thin film transistor array layer 304, a light emitting layer 305, and an encapsulation layer 306 sequentially stacked and disposed on the flexible base substrate corresponding to the display area 311. The encapsulation layer 306 covers the light emitting layer 305, covers a lateral side of the thin film transistor array layer 303 and a lateral side of the light emitting layer 305 near the non-display area 312, and partially covers the second polyimide layer 301b.

In a further embodiment, the thin film transistor array layer 304 comprises a gate insulating layer (GI) and a dielectric layer (OLD) stacked and disposed, and functional components arranged inside. The functional components comprise a polysilicon layer, a gate electrode (GE), and a source/drain electrode (S/D). The thin film transistor array layer 304 has a conventional structure, and the material and the thickness of each film layer adopted can be adjusted according to the requirements, and are not specifically limited in the present application.

In a further embodiment, the light emitting layer 305 is an OLED light emitting layer, and, that is, the flexible display panel of the present application is an OLED flexible display panel. The OLED light emitting layer comprises an anode, an OLED light emitting material layer, and a cathode stacked and disposed. The OLED light emitting layer has a conventional structure, and the material and the thickness of each film layer adopted can be adjusted according to the requirements, and are not specifically limited in the present application. In other embodiments, a liquid crystal display (LCD) and other light emitting flexible display panels can be prepared according to the requirements.

The encapsulation layer 306 has a conventional structure, and the material and the thickness adopted can be adjusted according to the requirements, and are not specifically limited in the present application.

By preparing composite substrate structure composed of a first polyimide layer, a water-oxygen barrier layer, a protective layer, and a second polyimide layer, the flexible display panel of the present application has desired water and oxygen barrier property and flexibility, and the protective layer covers a partial lateral side of the second polyimide layer in the non-display area and a lateral side of the water-oxygen barrier layer in the non-display area. Thus, the water and oxygen barrier property of the composite substrate structure is improved, thereby greatly reducing the probability of water and oxygen passing through the flexible base substrate, and improving the service lifespan of the prepared flexible display panel.

It can be understood that for those skilled in the art, equivalent replacements or changes can be made according to the technical solution and the inventive concept of the present application, and all these changes or replacements should fall within the protection scope of the claims attached to the present application.

What is claimed is:

1. A preparation method of a flexible display panel, comprising steps of:
    providing a rigid substrate, the rigid substrate having a panel area and a panel edge area divided by a laser cut line;
    preparing a first polyimide layer on the rigid substrate, the first polyimide layer being formed in the panel area and the panel edge area;
    depositing a water-oxygen barrier layer on the first polyimide layer, the water-oxygen barrier layer covering the first polyimide layer;
    preparing a protective layer on the water-oxygen barrier layer, the protective layer extending from the laser cut line to the panel area and the panel edge area respectively, wherein an initial thickness of the protective layer ranges from 0.5 to 5 μm;
    preparing a second polyimide layer on the protective layer and the water-oxygen barrier layer;
    preparing a panel display assembly on the second polyimide layer corresponding to the panel area; and
    separating the rigid substrate from the first polyimide layer, and cutting the panel edge area along the laser cut line to obtain the flexible display panel, wherein the protective layer retained in the panel area after being cut covers a partial lateral side of the second polyimide layer at the laser cut line and a lateral side of the water-oxygen barrier layer at the laser cut line.

2. The preparation method according to claim 1, wherein a material of the protective layer comprises at least one of aluminum, tin, lead, bismuth, silver, and copper.

3. The preparation method according to claim 1, wherein a material of the protective layer comprises at least one of an aluminum-based alloy, a tin-based alloy, a lead-based alloy, a bismuth-based alloy, a silver-based alloy, and a copper-based alloy.

4. The preparation method according to claim 1, wherein a thickness of the protective layer retained in the panel area after being cut ranges from 1 to 10 μm.

5. The preparation method according to claim 1, wherein the step of preparing the panel display assembly on the second polyimide layer corresponding to the panel area further comprises: sequentially preparing a thin film transistor array layer, a light emitting layer, and an encapsulation layer on the second polyimide layer corresponding to the panel area, wherein the encapsulation layer covers a lateral side of the thin film transistor array layer and a lateral side of the light emitting layer near the laser cut line, and partially covers the second polyimide layer.

6. A preparation method of a flexible display panel, comprising steps of:
    providing a rigid substrate, the rigid substrate having a panel area and a panel edge area divided by a laser cut line;
    preparing a first polyimide layer on the rigid substrate, the first polyimide layer being formed in the panel area and the panel edge area;
    depositing a water-oxygen barrier layer on the first polyimide layer, the water-oxygen barrier layer covering the first polyimide layer;
    preparing a protective layer on the water-oxygen barrier layer, the protective layer extending from the laser cut line to the panel area and the panel edge area respectively;
    preparing a second polyimide layer on the protective layer and the water-oxygen barrier layer;
    preparing a panel display assembly on the second polyimide layer corresponding to the panel area; and
    separating the rigid substrate from the first polyimide layer, and cutting the panel edge area along the laser cut line to obtain the flexible display panel.

7. The preparation method according to claim 6, wherein the step of cutting the panel edge area along the laser cut line further comprises: melting and solidifying the protective layer in a cutting process, wherein the protective layer retained in the panel area after being cut covers a partial lateral side of the second polyimide layer at the laser cut line and a lateral side of the water-oxygen barrier layer at the laser cut line.

8. The preparation method according to claim 7, wherein the protective layer retained in the panel area after being cut further covers a partial lateral side of the first polyimide layer at the laser cut line.

9. The preparation method according to claim 6, wherein a material of the protective layer comprises at least one of aluminum, tin, lead, bismuth, silver, and copper.

10. The preparation method according to claim 6, wherein a material of the protective layer comprises at least one of an aluminum-based alloy, a tin-based alloy, a lead-based alloy, a bismuth-based alloy, a silver-based alloy, and a copper-based alloy.

11. The preparation method according to claim 6, wherein an initial thickness of the protective layer ranges from 0.5 to 5 µm.

12. The preparation method according to claim 6, wherein a thickness of the protective layer retained in the panel area after being cut ranges from 1 to 10 µm.

13. The preparation method according to claim 6, wherein the step of preparing the panel display assembly on the second polyimide layer corresponding to the panel area further comprises: sequentially preparing a thin film transistor array layer, a light emitting layer, and an encapsulation layer on the second polyimide layer corresponding to the panel area, wherein the encapsulation layer covers a lateral side of the thin film transistor array layer and a lateral side of the light emitting layer near the laser cut line, and partially covers the second polyimide layer.

14. A flexible display panel comprising a panel area, the panel area comprising a display area and a non-display area, wherein the flexible display panel further comprises:
  a flexible base substrate comprising a first polyimide layer, a water-oxygen barrier layer, and a second polyimide layer sequentially stacked and disposed, the flexible base substrate further comprising a protective layer disposed in the non-display area, wherein the protective layer covers a partial lateral side of the second polyimide layer in the non-display area and a lateral side of the water-oxygen barrier layer in the non-display area; and
  a panel display assembly disposed on the flexible base substrate,
  wherein a material of the protective layer comprises at least one of aluminum, tin, lead, bismuth, silver, and copper, or at least one of an aluminum-based alloy, a tin-based alloy, a lead-based alloy, a bismuth-based alloy, a silver-based alloy, and a copper-based alloy.

15. The flexible display panel according to claim 14, wherein an outer surface of the protective layer protrudes from a side of the non-display area.

16. The flexible display panel according to claim 14, wherein a material of the protective layer comprises at least one of an aluminum-based alloy, a tin-based alloy, a lead-based alloy, a bismuth-based alloy, a silver-based alloy, and a copper-based alloy.

17. The flexible display panel according to claim 14, wherein a thickness of the protective layer ranges from 1 to 10 µm.

18. The flexible display panel according to claim 14, wherein the protective layer further covers a partial lateral side of the first polyimide layer at the laser cut line.

19. The flexible display panel according to claim 14, wherein the panel display assembly comprise a thin film transistor array layer, a light emitting layer, and an encapsulation layer sequentially stacked and disposed on the second polyimide layer corresponding to the display area, wherein the encapsulation layer covers a lateral side of the thin film transistor array layer and a lateral side of the light emitting layer in the non-display area, and partially covers the second polyimide layer.

* * * * *